United States Patent [19]

Graham et al.

[11] Patent Number: 5,296,074
[45] Date of Patent: Mar. 22, 1994

[54] METHOD FOR BONDING SMALL ELECTRONIC COMPONENTS

[75] Inventors: William F. Graham, Landenberg; Mel A. Lofurno, Kennett Square; Byron C. Sakiadis, Chadds Ford, all of Pa.

[73] Assignee: E. I. Du Pont de Nemours and Company, Wilmington, Del.

[21] Appl. No.: 13,230

[22] Filed: Feb. 1, 1993

Related U.S. Application Data

[63] Continuation of Ser. No. 853,879, Mar. 18, 1992, abandoned, which is a continuation of Ser. No. 631,263, Dec. 20, 1990, abandoned, which is a continuation of Ser. No. 469,812, Jan. 23, 1990, abandoned, which is a continuation-in-part of Ser. No. 171,974, Mar. 23, 1988, abandoned, which is a continuation-in-part of Ser. No. 88,141, Aug. 21, 1987, abandoned, which is a continuation-in-part of Ser. No. 31,793, Mar. 30, 1987, abandoned.

[51] Int. Cl.$^5$ ............................................. B32B 31/00
[52] U.S. Cl. .............................. 156/309.9; 156/312; 156/320; 156/322; 29/832
[58] Field of Search ................. 156/264, 281, 309.9, 156/312, 320, 322, 276, 272.4; 29/832, 841; 357/80; 252/514, 500; 174/50, 50.62, 52.1, 52.3

[56] References Cited

U.S. PATENT DOCUMENTS

| | | | |
|---|---|---|---|
| 3,446,654 | 5/1969 | Barth et al. | 117/123 |
| 3,494,017 | 2/1970 | Tyler . | |
| 3,652,361 | 3/1972 | Leatherman | 156/272.4 |
| 3,716,434 | 2/1973 | Cook et al. | 156/295 X |
| 3,772,248 | 11/1973 | Brown et al. | 360/49 |
| 3,926,916 | 12/1975 | Mastrangelo | 252/63.5 |
| 3,941,641 | 3/1976 | Heller, Jr. et al. | 156/272.4 |
| 3,978,378 | 8/1976 | Tigner et al. | 317/258 |
| 4,029,628 | 6/1977 | Fredberg . | |
| 4,115,178 | 9/1978 | Cone et al. | 156/295 X |
| 4,233,103 | 11/1980 | Shaneen | 156/331 |
| 4,233,191 | 11/1980 | Reuter et al. | 252/514 X |
| 4,377,652 | 3/1983 | Ohmura et al. | 524/104 |
| 4,381,602 | 5/1983 | McIver | 29/832 X |
| 4,395,527 | 7/1983 | Berger | 528/26 |
| 4,480,009 | 10/1984 | Berger | 428/447 |
| 4,499,149 | 2/1985 | Berger | 428/447 |
| 4,606,962 | 8/1986 | Reylek et al. | 156/250 X |
| 4,616,413 | 10/1986 | Iliou et al. | 29/832 |
| 4,624,724 | 11/1986 | Davis | 156/264 |
| 4,681,928 | 7/1987 | Berger et al. | 528/353 |
| 4,701,279 | 10/1987 | Kawaguchi et al. | 252/514 X |
| 4,743,399 | 5/1988 | Kirchhoff | 252/514 X |
| 4,752,415 | 6/1988 | Iwaskow et al. | 252/511 |
| 4,803,124 | 2/1989 | Kunz | 156/295 X |

FOREIGN PATENT DOCUMENTS

| | | |
|---|---|---|
| 0051165 | 10/1981 | European Pat. Off. . |
| 51165 | 5/1982 | European Pat. Off. . |
| 0135416 | 7/1984 | European Pat. Off. . |
| 0142783 | 11/1984 | European Pat. Off. . |
| 0198194 | 3/1986 | European Pat. Off. . |
| 0215502 | 8/1986 | European Pat. Off. . |
| 514007 | 8/1980 | Japan . |
| 8202457 | 7/1982 | PCT Int'l Appl. ............... 427/96 |

OTHER PUBLICATIONS

Modern Plastics Encyclopedia, Oct. 1983, vol. 60, No. 10 A, pp. 472–473.
Heat-Resistant Materials for Electric and Electronic Uses, Hanai, and Hirata, Yuki Gosei Kagaku Kyokai, Shi 42, No. 11: 1074–80, 1984.

*Primary Examiner*—Jeff H. Aftergut

[57] ABSTRACT

A method for rapidly bonding a small electronic component to a mating surface of a high surface energy substrate using an adhesive pad made from a substantially amorphous, solvent-free thermoplastic polymer.

12 Claims, 1 Drawing Sheet

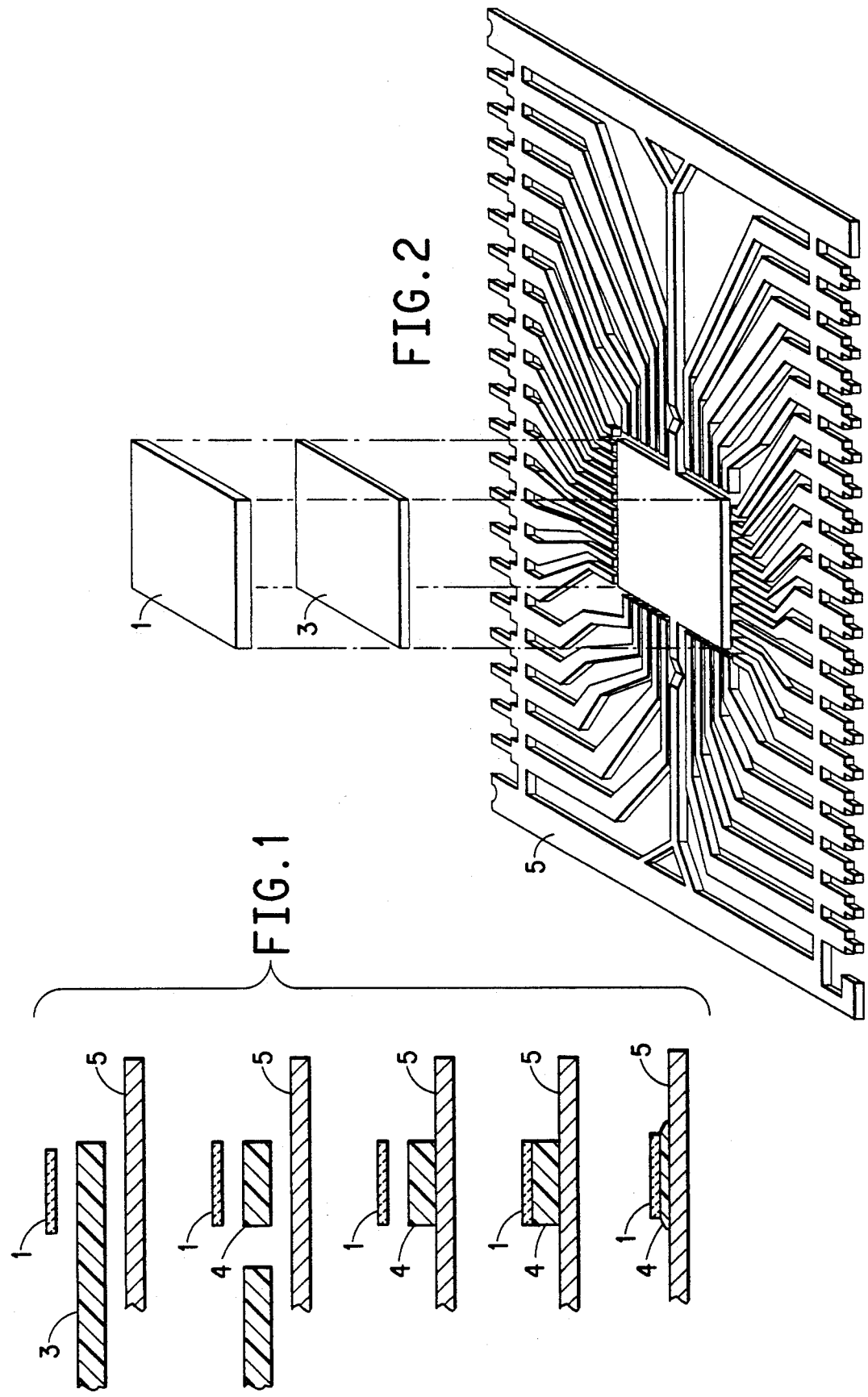

METHOD FOR BONDING SMALL ELECTRONIC COMPONENTS

CROSS-REFERENCE TO RELATED APPLICATION

This application is a continuation of copending application Ser. No. 07/853,879 filed Mar. 18, 1992, now abandoned, which is a continuation of application Ser. No. 07/631,263 filed Dec. 20, 1990, now abandoned, which is a continuation of application Ser. No. 07/469,812 filed Jan. 23, 1990, now abandoned, which is a continuation-in-part of application Ser. No. 07/171,974 filed Mar. 23, 1988, now abandoned, which is a continuation-in-part of application Ser. No. 07/088,141 filed Aug. 21, 1987, now abandoned, which is a continuation-in-part of application Ser. No. 07/031,793 filed Mar. 30, 1987, now abandoned.

FIELD OF INVENTION

The invention relates to a method for bonding small electronic components such as integrated circuit chips to substrates such as lead frames.

BACKGROUND OF THE INVENTION

In the mass production of integrated chip assemblies, a particularly critical step to productivity of the process is the step of bonding the integrated circuit (IC) chip to its substrate. Such substrates include lead frames, MLC chips, diodes, quartz crystals and the like. Heretofore, this has been done either by bonding the IC chip by means of a eutectic process, inorganic binder or by means of a filled epoxy adhesive. In the latter two cases, the assembly must be removed from the assembly line and processed further in some way. For example, in the case of inorganic binders, the assembly must be fired off-line to effect sintering of the inorganic binder and bonding of the IC chip to the substrate, thus removing the part from the assembly sequence for up to two hours typically and frequently longer. Similarly, in the case of filled epoxy binders, the assembly must be removed from the assembly sequence to allow curing (crosslinking) of the epoxy resin, which may require from several minutes to as much as an hour for completion.

From the foregoing description of the current state of the art, it is evident that there is a very substantial unmet need for a method of bonding IC chips to substrates by which appropriate adhesion of the IC chip to the substrate can be achieved so quickly that "in-line" assembly is possible. The primary objectives of such a process would be to have a bonding system that would result in higher throughput, higher yields, improved device reliability and effectively lower cost.

To achieve these primary objectives, it is necessary that the bonding system meet the secondary objectives of being adaptable to a highly automated in-line process (eliminating off-line processing altogether) by which the mounted IC chip can be conveyed directly and immediately to wire bonding.

SUMMARY OF THE INVENTION

The invention is directed to a method for rapidly bonding a small electronic component to a mating surface of a high surface energy substrate comprising the sequential steps of:

(1) Forming a continuous filament of non-olefinic, substantially amorphous, solvent-free thermoplastic polymer, at least one dimension of which is substantially equal to or greater than a lateral dimension of a mating surface of the small electronic component, the polymer being further characterized in that $T_g$ is at least 30° C.,
$T_b$ is below −30° C.,
$S_w$ is less than 1.0% wt., and
Extractable ionics are less than 10 ppm by wt.;

(2) Cutting the filament to form an adhesive pad having both lateral dimensions substantially equal to or greater than a corresponding lateral dimensions of the mating surface of the small electronic component and having a thickness of 25–125 micrometers;

(3) Simultaneously preheating the mating surfaces of both the substrate and the small electronic component so that a temperature of the surfaces exceeds the Tg of the amorphous adhesive;

(4) Positioning the adhesive pad upon the heated substrate surface with an application of slight pressure to effect heat transfer from the substrate to the adhesive pad, thus softening the adhesive without incurring adhesive flow;

(5) Positioning the heated small electronic component upon the heated adhesive pad;

(6) Laminating the small electronic component to the substrate by applying a higher pressure to the small electronic component to reduce the thickness of the adhesive pad by 0.5 to 5% and releasing the pressure on the small electronic component within 2 seconds; and (7) cooling the laminated component assembly.

BRIEF DESCRIPTION OF THE DRAWING

The Drawing consists of two figures, of which

FIG. 1 is a schematic representation of the manipulative steps of the method of the invention and FIG. 2 is an exploded view of an integrated chip assembly which has been assembled by the method of the invention.

DETAILED DESCRIPTION OF THE DRAWING

Referring now to FIG. 2 of the Drawing, which is a schematic exploded view of an integrated circuit chip assembly upon a metal lead frame substrate. In particular, adhesive pad 3 is interposed between the upper surface of metal lead frame substrate 5 within chip positioning area 5 and the lower surface of the IC chip 1.

Now referring to FIG. 1 of the Drawing, which is a schematic representation of the steps of the method of the invention, a continuous filament of non-olefinic substantially amorphous solvent-free thermoplastic polymer as characterized hereinabove having a ribbon configuration in which the width of the ribbon 3 is approximately the same as the width of one of the sides of a rectangular IC chip 1. This ribbon 3 is then cut to a length which is approximately the same as the other side of the IC chip. The ribbon thickness is between 25 and 125 micrometers.

At the same time, the surfaces of both the IC chip 1 and the lead frame substrate 5 are heated so that the surface temperature of at least one of them facing the adhesive pad 4 exceeds the glass transition temperature ($T_g$) of the adhesive. A mechanical gripping device, not shown, then places the adhesive pad 4 upon the heated surface of the lead frame substrate 5 and applies a slight pressure to secure placement of the pad 4 and to effect transfer of heat from the substrate 5 by which the adhesive is softened, but not so that any appreciable adhesive flow will take place. Integrated circuit chip 1 is then placed by mechanical means atop the adhesive pad 4 and laminated thereto by applying a higher pressure to the IC chip 1 sufficient to reduce the thickness of the adhesive pad 4 by 0.5 to 5% within an interval of 5 seconds, and preferably about 1% in 2 seconds or less. When lamination is complete, pressure on the IC chip 1 is released and the laminated assembly is cooled. The lead frame 5 having the IC chip 1 laminated thereto is then conveyed to another position for further processing such as wire bonding and the insertion of other functional electronic parts.

DETAILED DESCRIPTION OF THE INVENTION

A. Adhesive Material

The adhesive materials which are suitable for use in the invention are non-olefinic, predominantly amorphous, substantially solvent-free thermoplastic polymers having the following essential properties:

$T_g$ is at least 30° C., and preferably at least 50° C.,
$T_b$ is below $-30°$ C.,
$S_w$ is less then 1.0% wt., and
Extractable ionics are less than 10 ppm by weight.

Each of these properties is necessary to obtain uniformly the essential properties of rapid bonding, adequate bonding (adhesion) strength and low degree of change upon aging and extended use.

As a practical matter, the maximum $T_g$ of polymers which is likely to be useful in the process is 300°–400° C. Polymers having higher $T_g$ are, of course, more difficult to heat to the appropriate viscosity for binding.

Non-olefinicity of the material is required to obtain good adhesion to high surface energy substrates, such as metals, alumina and silica. On the other hand, both the $T_g$ and $T_b$ limitations are necessary to give the proper rheology for fast, strong bonding at high application temperatures. The limits on water absorption and extractable ionics are essential to assure that the bond between these materials and the substrate is not degraded over long periods of time.

A wide variety of non-olefinic polymeric materials are available which may possess properties which meet the above-referred criteria such as polyarylates, polyetheretherketones, polyetherketoneketones, polyetherimides, nylon polymers and copolymers, polycarbonates, polyphenyleneoxides, polyesters and copolyesters, acrylic and methacrylic polymers and copolymers, copolymers of butadiene and styrene, copolymers of butadiene and acrylonitrile, copolymers of butadiene and acrylates or methacrylates, copolymers of styrene and acrylates or methacrylates and compatible mixtures thereof. As used herein, the term "copolymer" includes not only bipolymers but terpolymers and other multipolymers.

From this list, it can be seen that the chemical composition of the polymer is not by itself critical so long as the polymer, either with or without filler, meets all of the above-referred criteria.

It is also necessary that the adhesives used in the invention contain substantially no volatile solvents. Thus to avoid formation of bubbles and voids during the hot bonding process, the amount of such solvents must be less than 5% wt. and preferably no more 1% wt. or even less. Such low solvent content is also preferred to ensure that the adhesive is non-tacky at room temperature.

Furthermore, it is necessary that the adhesive for use in the invention be amorphous, i.e., non-crystalline, because of the tendency of highly crystalline polymers to shrink away from the substrate upon cooling.

It will be recognized that in many applications it may be desirable to make the adhesive used in the process more thermally conductive or more electrically conductive. This can be done by the addition of finely divided particles of conductive metals such as Ag, Au, Cu, Pd/Ag, Ni and the like and electrically conductive metal oxides or metal salts. While substantial amounts of these materials may be added to the adhesive polymers, it is nevertheless recognized that they should not exceed 50% by volume of the total adhesive and preferably 30% or less. If more than about 50% of filler is used, degradation of the strength properties is likely to be excessive.

The polymeric adhesive material is formed, either filled or unfilled, in a filamentary form such that with a single cut it can be formed into a pad of appropriate size to adhere the electronic component. Thus, the adhesive may be in the form of a thin ribbon which is approximately as wide as the part to be adhered and which then can be cut to length in a single cutting action to form a "pad" which approximates the other dimension of the component to be bonded. Similarly, the adhesive can be formed as a monofilament having about the same cross-section as the lateral edges of the component chip to be bonded. This filament can then be sliced to appropriate thickness and used in the process. Another form can be a thin filament for use in bonding very small components such as IC's (less than 1.27 millimeters) by softening the tip of the filament and transferring a small amount of the polymer by bringing it into contact with the substrate.

The thickness of the adhesive must, of course, be sufficient to provide enough adhesive strength for effective bonding. However, if the adhesive exceeds about 5 mils (127 micrometers) in thickness, it is too slow to bond and if it is less than 1 mil (25 micrometers) in thickness, the adhesive is difficult to handle and placement is particularly difficult. Thus a ribbon thickness of 1–2 mils (25–50 micrometers) is preferred which provides a quite adequate amount of adhesive to form a strong bond between the component and the substrate. In any event, the thickness of the cut adhesive pad should be on the order of 25–125 micrometers, 25–50 micrometers being preferred.

In certain instances where it is desired to augment the physical properties of the adhesive pad, the pad can be applied as a laminate in which a layer of the adhesive is laminated to either or both sides of a film of dielectric polymer such as a polyimide, which has both outstanding dielectric properties as well as resistance against thermal degradation. This technique can be used, for example, to obtain greater dimensional stability or thermal or electrical conductivity of the adhesive pad.

In most instances, it is preferred that the adhesive pad be approximately the same size as the component to be bonded, or perhaps slightly larger. However, it is obvious that the relative size of the pad is not narrowly critical so long as there is sufficient adhesive to present strong bonding. Nevertheless, it is preferred that the electronic component be fully supported by the adhesive in order to avoid high stress points in the component which might lead to unreliability in performance. A layer adhesive pad area is also desirable for greater heat transfer. Thus the surface area of the adhesive pad should be at least about 80% and preferably about 90% or more of the surface area of the piece being bonded.

The adhesive used in the method of the invention can be formed into its appropriate approximate shape by the usual prior art method such as solvent casting and by melt extrusion. A suitable method for tape casting is illustrated in U.S. Pat. Nos. 4,536,535 and 4,613,648 to Usala. Upon completion of casting, sheets of the material are then slit to appropriate width and the resultant ribbons are wound on spools for use.

B. Electronic Component

The method of the invention can be used for bonding to substrates a wide variety of discrete electronic components, both active and passive, such as capacitors, transistors, resistors, diodes and the like as well as integrated circuit chips.

In general, the method will be used most advantageously to affix small electronic components to substrates, e.g., 0.15×0.15 mm "jumper" chips, conventional 15×15 mm IC chips and other components which have a mating surface smaller than about one square inch (6.45 cm²).

C. Substrate

The method of the invention can be used to bond IC chips to virtually any kind of high surface energy substrate. Thus, the invention can be used on organic substrates as well as ceramic, metal and metal core substrates.

organic substrates are made from such materials as epoxy-impregnated paper and glass fibers, phenolic and resin-impregnated and paper and polyimide resins, all of which may be laminated with copper foil.

Ceramic substrates are generally ceramic oxides of which $Al_2O_3$ and $SiO_2$ predominate. However, previously fired patterned substrates such as those laid down from screen-printed conductor, resistor and dielectric thick films and from green tapes may also be used. Other ceramic substrate materials include BeO, AlN and metal core substrates such as porcelain enamelled steel. One of the most widespread uses of the invention will be to bond IC chips to metal lead frames.

All of these substrates are characterized by high energy surfaces which are wetted by the non-olefinic polymeric materials used in the invention.

D. Process Parameters

In carrying out the process of the invention, any conventional ribbon feeder can be used which has been adapted to provide suitable means for feeding and cutting the adhesive ribbon. Ribbon feeders of this type are frequently used for die attachment in the electronics industry.

In conventional ribbon feeders, the die attach pickup "head" is comprised of an open-ended tube which picks up the cut adhesive ribbon by means of vacuum applied to the tube. The application of a vacuum in this manner tends to deform the pad as it is placed on the substrate. Therefore, to avoid this problem, applicants have devised a modified vacuum pick-up head with a porous tip. By this means, the vacuum is applied more evenly across the entire area of the pad and the pad bearing surface is increased. Therefore, virtually no distortion of the pad takes place.

In preheating the surface of the substrate and the mating surface of the electronic component preparatory to positioning the adhesive pad on the substrate, it is not necessary that both surfaces be heated above the $T_g$ of the adhesive. It is sufficient that only one of them be so heated. However, in some instances, it may be preferred to heat both surfaces to such a level in order to speed up the bonding process. It is not necessary that the adhesive material be heated substantially above its $T_g$ since it is not desired that the adhesive undergo any flow until the laminating step of the process.

When the adhesive pad is placed on the heated substrate, it is necessary that it undergo a slight pressure to ensure that it will remain in place as it is positioned. The slight pressure facilitates initial heat transfer from the heated substrate to the adhesive material and thus the surface of the adhesive becomes tacky very rapidly.

The heat transfer process between the substrate and the pad and between the electronic component and the pad continues as laminating pressure is applied to the assemblage. This results in some flow of the adhesive by which the thickness of the adhesive pad is reduced by 0.5-5% within a very short dwell time, which is always 5 seconds or less and usually 2 seconds or less. For most production lines, it will be preferred to use operating conditions that permit the bonding operation to be applied within 1 second.

It is sometimes preferred that the laminating step include a gentle, patterned scrubbing action which enhances both the rate of heat transfer, substrate wetting and the strength of the adhesive bond.

Upon completion of the lamination step, the bonded component is cooled. No special cooling process is needed for this. Ambient air cooling is sufficient.

ABBREVIATIONS AND DEFINITIONS $T_g$ Glass transition temperature $T_b$ Embrittlement temperature, i.e., the temperature at which the material behavior changes from ductile to brittle. Brittle behavior is characterized by materials which have an elongation-at-break of less than about 2%.

$s_w$ Equilibrium water absorption measured at 23° C. for 24 hours.

As used herein, the term "amorphous polymer" refers to polymers having less than 50% crystallinity.

TEST PROCEDURES

Tensile Modulus—ASTM Test D882

Other tensile measurements were made using an Instron ® tester at a pull rate of 0.0125 inches per inch.minute at room temperature. Test specimens were 0.25×4 inch (0.6×10 cm) strips cut from larger material sheets.

Extractable ionics were determined by immersing the adhesive specimen in deionized water for 20 hours at either 100° C. or 120° C. and then analyzing the extract for Na, K, $NH_4$, Cl and $SO_4$ ions.

Water Absorption ($S_w$)—ASTM Test D570 (24 hrs. at 73° F.)

Melting Temperature ($T_m$)—Differential Scanning Calorimeter (DSC)

Glass Transition Temperature ($T_g$)—Differential Scanning Calorimeter, cooling cycle or mechanical spectrometer, tan delta Melt Viscosity—Rigid Polymers—Instron ® Rheometer Compliant Polymers—Compression Flow Test The invention can perhaps be further understood by reference to the following examples:

EXAMPLES

Examples 1-6

A series of six adhesive ribbons was prepared in which filled and unfilled strips of two low molecular weight polymers and one high molecular weight polymer were tested as to their tensile properties. All tensile tests were conducted on 0.25×4 inch (0.64×10.2 cm) long ribbons cut from a larger sheet of material. The results of the tests are shown in Table 1 which follows:

TABLE 1

Tensile Properties of Adhesive Pads

| | Example | | | | | |
|---|---|---|---|---|---|---|
| | 1 | 2 | 3 | 4 | 5 | 6 |
| Polymer | Poly-etherimide | Poly-etherimide | Acrylic resin | Acrylic resin | Acrylic resin | Acrylic resin |
| Filler | None | 30% v. Ag. | None | 30% v. Ag. | None | 30% v. Ag. |
| Tensile Modulus MPa (1) × $10^5$ psi | 4.0 | 10.9 | 0.5 | 1.3 | 1.0 | 3.4 |
| Film Thick. Mils | 2.0 | 1.0 | 1.8 | 2.2 | 1.6 | 2.0 |
| Yield % | — | — | 3.0 | 1.3 | 2.0 | 1.2 |
| Recovery % (2) | 94 | — | 50 | 45 | 50 | — |
| Elongatn. at Break % | — | 1.2 | — | — | — | 1-7 |
| Stretch % | — | — | 10 | 10 | 5 | — |

(1) ¼% stretch at 0.125 in/(in. minute) stretch rate.
(2) After 2% stretch.

The data in Table 1 show that the tensile modulus of the silver-filled adhesive strips was about three times the modulus of the unfilled materials. This was true of both of the stiff polymers (unfilled modulus > 3 × $10^5$ psi and the compliant polymers (unfilled modulus > 3 × $10^5$ psi.

The stiffer poly(etherimide) strips exhibited the highest modulus while the acrylics exhibited lower modulus. The stiffer, i.e., more non-compliant, polymers showed high recovery and low elongation at break, while the more compliant acrylic polymers showed low yield and recovery but high stretchability. Compatible blends of stiff and compliant polymers can be used to obtain a more optimum combination of properties.

Examples 7-12

The following examples illustrate the operating conditions which have been used in field tests of die bonding with various filled and unfilled adhesives in accordance with the invention. The composition of the adhesives and the bonding conditions are summarized in Table 2 which follows:

TABLE 2

BONDING CONDITIONS FOR FIELD TEST DIE BONDING

| | Example | | | | | |
|---|---|---|---|---|---|---|
| | 7 | 8 | 9 | 10 | 11 | 12 |
| Composition | 30% Ag-filled Polyetherimide | 30% Ag-filled Polyacrylate | Unfilled Polyethylene Terephthalate | Unfilled Polyethyleneterephthalate | Unfilled Polyetherimide | 15% Ag-Filled Polyetherimide |
| Ribbon Dimension | | | | | | |
| Thickness, Mil | 1.7 | 2.0 avg. | 1.0 | 2.0 | 2.0 | 2.0 |
| Width, Mil | 126 | 145 | Die + 6 Mil | Die + 6 Mil | Die + 6 Mil | Die + 6 Mil |
| Length, Mil | 83 | 145 | Die + 6 Mil | Die + 6 Mil | Die + 6 Mil | Die + 6 Mil |
| Thermal Conditions, Heater Block Surface Temperature °C. | 450 | 400 | 315 | 315 | 405 | 410 |
| Die Temperature (Estimated), °C. | 100 | 100 | 100 | 100 | 100 | 100 |
| Bonding Time, Seconds | 1 | 2 | 1 | 1 | 2 | 2 |
| Load, g | 100 | 100 | 60 | 60 | 100 | 100 |
| Scrubbing | Yes | No | No | No | Yes | Yes |

Heating the Lead Frame: In the foregoing Examples 7-12, the metal lead frame substrate was heated by bringing it into contact with a heating block maintained at a constant high temperature. In this procedure, one surface of the frame contacts the heating block while the other surface is exposed to ambient temperature. At these conditions, a copper or silver lead frame 10 mils (254 micrometers) thick can be heated from 23° C. to within 10° C. of a heating block temperature of 450° C. in less than 0.001 seconds. This holds true if there is no resistance to heat flow at the heating block-lead frame interface. In practice, there will always be a contact resistance at that interface. However, this resistance is minimized by pressing the lead frame against the heating block surface to eliminate any air film at the interface. In view of these considerations, it is reasonable to estimate an actual heating time for the lead frame of less than, say, 0.01 seconds for a wide range of specified bonding temperatures up to 450° C.

Heating the Adhesive—Transient heat transfer computations for heating the adhesive placed cold (23° C.) on a hot lead frame show that the adhesive temperature will be within 10° C. of the lead frame temperature in less than 0.09 seconds. This holds true for a typical potential unfilled adhesive bit 2.5 micrometers or less, thick placed on a block heated up to 450° C.

Combining the results obtained above with those of the lead frame heating step, it is clear that the lead frame and unfilled adhesive (2.5 micrometers or less thick) can be heated from room temperature to the desired temperature in less than about 0.1 seconds.

Heating the IC Chip: In practice, it has been found to be difficult to heat the IC chip by conduction from a large heated mass because of the very small heat transfer surface presented by the collet which holds the chip for bonding. It is therefore preferred to heat the IC chip by direct contact with a heated block or by hot air flow over the chip before contacting the adhesive.

Transient heat transfer computations for heating a silica die, 21 mils thick (533 micrometers), from, say 100° C. to within 10° C. of a heating block maintained at 450° C. yield a heating time of 0.75 seconds. This holds true if heat flow from the heating block to the die surface is unrestricted. Considering the resistance to heat flow due to the intervening adhesive (2.5 mils or 64 micrometers thick) increases the die heating time to 1.7 seconds. In the above calculations, the assumption was made that the die collet does some heating of the die, raising its temperature to 100° C. If this temperature can be increased by collet heating, then the die heating time will be less than 1.7 seconds.

The results of of the transient heat transfer computations discussed above can be summarized as follows:

| Process | Heating Time |
| --- | --- |
| Heating of Copper or Silver Lead Frame (254 micrometers thick) | 0.01 seconds |
| Heating of Adhesive (64 micrometers thick) | 0.09 seconds |
| Heating of Die from Heating Block (533 micrometers thick) | 1.7 seconds |
| Total Heating Time | 1.8 seconds |

The above total heating time of 1.8 seconds applies to heating all three components, lead frame, adhesive and die, from 23° C. up to 450° C. This calculated heating time is a maximum time because die heating, which accounts for most of the total heating time, need not continue until the die is heated to 450° C. This is obviously the case because bonding takes place at the die surface through which heat flows from the heating block. Furthermore, it is undesirable to heat the entire die to such high temperature. From these computations, it is quite clear that total heating times for assembly of all the three components would be about 1 second when only a portion of the die is heated to near bonding temperature.

We claim:

1. A method for rapidly bonding a small electronic component having a mating surface smaller than about one square inch selected from the class consisting of capacitor,
   (a) cutting a continuous ribbon having a thickness of 25 to 125 micrometers of non-olefinic, substantially amorphous, solvent-free thermoplastic polymer, the polymer being further characterized in that
   $T_g$ is at least 30° C.
   $T_b$ is below −30° C.
   $S_w$ is less than 1.0% wt. and
   extractable ionics are less than 10 ppm by wt.,
   such that the cut ribbon forms the adhesive pad having both lateral dimensions substantially equal to or greater than the electronic component to be bonded;
   (b) heating mating surfaces of the electronic component and substrate so that the temperature of at least one of the surfaces exceeds the $T_g$ of the adhesive pad;
   (c) positioning the adhesive pad upon the heated substrate with an application of slight pressure to effect heat transfer from the substrate to the adhesive pad, thus softening the adhesive without incurring adhesive flow;
   (d) positioning the small electronic component upon the heated adhesive pad resulting in assembly of the electronic component, adhesive pad and substrates;
   (e) laminating the small electronic component to the substrate by applying a higher pressure to the small electronic component to reduce the thickness of the adhesive pad by 0.5 to 3% followed by a release of pressure within about 5 seconds.

2. A method for rapidly bonding a small electronic component having a mating surface smaller than about one square inch selected from the class consisting of capacitor, transistor, resistor, diode and integrated circuit chip to a substrate employing an adhesive pad between the electronic component and the substrate comprising the steps of:
   (a) cutting a continuous ribbon having a thickness of 25 to 125 micrometers of non-olefinic, substantially amorphous, solvent-free thermoplastic polymer, the polymer being further characterized in that
   $T_g$ is at least 30° C.
   $T_b$ is below −30° C.
   $S_w$ is less than 1.0% wt. and
   extractable ionics are less than 10 ppm by wt.,
   such that the cut ribbon forms the adhesive pad having both lateral dimensions substantially equal to or greater than the electronic component to be bonded;
   (b) heating mating surface of the electronic component to near the bonding temperature and heating the substrate so that the temperature exceeds the $T_g$ of the adhesive pad;
   (c) positioning the adhesive pad upon the heated substrate with an application of slight pressure to effect heat transfer from the substrate to the adhesive pad, tush softening the adhesive without incurring adhesive flow;
   (d) positioning the small electronic component upon the heated adhesive pad resulting in assembly of the electronic component, adhesive pad and substrates whereby the heating for steps (b), (c) and (d) is about one second;
   (e) laminating the small electronic component to the substrate by applying a higher pressure to the small electronic component to reduce the thickness of the adhesive pad by 0.5 to 5% followed by a release of pressure within about 5 seconds.

3. The method of claim 1 or 2 in which the substrate and small electronic component are heated by direct heat transfer from inert hot gases.

4. The method of claim 1 or 2 in which the small electronic component is an integrated circuit chip.

5. The method of claim 4 in which the substrate is a metallic lead frame.

6. The method of claim 1 in which the substrate is a ceramic oxide.

7. The method of claim 1 or 2 in which the adhesive is comprised of a compliant polymer having a low unfilled tensile modulus, $T_g$ below 140° C. and viscosity of less than 1 M Pa.s at the lamination temperature.

8. The method of claim 10 in which the adhesive is comprised of a mixture of compliant and rigid polymers.

9. The method of claim 2 in which the adhesive is comprised of a rigid polymer having a high unfilled tensile modulus, $T_g$ at least 140° C. melting temperature at least 230° C. and viscosity of less than 5200 Pa.s at the lamination temperature.

10. The method of claim 9 in which the adhesive is comprised of a mixture of compliant and rigid polyers.

11. The method of claim 1 or 2 in which the polymer adhesive is filled with finely divided particles of heat-conductive solids.

12. The method of claim 1 or 2 in which the adhesive is filled with finely divided particles of electrically conductive solids.

* * * * *

UNITED STATES PATENT AND TRADEMARK OFFICE
CERTIFICATE OF CORRECTION

PATENT NO. : 5,296,074
DATED : March 22, 1994
INVENTOR(S) : William F. Graham, Mel A. Lofurno, and Byron C. Sakiadis It is certified that error appears in the above-identified patent and that said Letters Patent is hereby corrected as shown below:

IN THE CLAIMS:

Col. 9, line 42 of Claim 1 after "capacitor", please insert --transistor, resistor, diode and integrated circuit chip to a ceramic substrate employing an adhesive pad between the electronic component and the substrate comprising the steps of--.

Col. 9, line 49, Claim 1, part A change the word "tonics" to --ionics--.

Col. 10, line 29, Claim 2, part C change the word "tush" to --thus--.

Col. 10, line 53, Claim 8 change the number "10" to --7--.

Col. 10, line 56, Claim 9 after "claim" please insert --1 or--.

Col. 10, line 59, Claim 9 change the number "5200" to --5000--.

Signed and Sealed this

Sixteenth Day of August, 1994

Attest:

BRUCE LEHMAN

Attesting Officer

Commissioner of Patents and Trademarks